United States Patent
Rahim et al.

(10) Patent No.: US 7,361,961 B2
(45) Date of Patent: Apr. 22, 2008

(54) METHOD AND APPARATUS WITH VARYING GATE OXIDE THICKNESS

(75) Inventors: Irfan Rahim, San Jose, CA (US); Yow-Juang Bill Liu, San Jose, CA (US); Jeffrey Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 200 days.

(21) Appl. No.: 11/114,455

(22) Filed: Apr. 25, 2005

(65) Prior Publication Data

US 2006/0237784 A1    Oct. 26, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/393; 257/903
(58) Field of Classification Search ........ 257/379–381, 257/393, 406, 410, 903, 904
See application file for complete search history.

(56) References Cited

U.S. PATENT DOCUMENTS

| | | | |
|---|---|---|---|
| 6,146,948 A | 11/2000 | Wu et al. | |
| 6,388,504 B1 | 5/2002 | Goto et al. | |
| 6,670,248 B1 | 12/2003 | Ang et al. | |
| 2001/0054729 A1 | 12/2001 | Divakaruni et al. | |
| 2002/0172071 A1 | 11/2002 | Feurle et al. | |
| 2003/0022422 A1* | 1/2003 | Torii et al. | 438/183 |
| 2004/0129997 A1* | 7/2004 | Morifuji | 257/500 |
| 2004/0246780 A1 | 12/2004 | Kawahara et al. | |
| 2005/0156255 A1* | 7/2005 | Yao et al. | 257/410 |
| 2005/0231261 A1* | 10/2005 | Chen | 327/333 |

OTHER PUBLICATIONS

Imai et al., "CMOS device optimization for system-on-a-chip applications", Electron Devices Meeting, IEDM Technical Digest, Piscataway, NJ, USA, IEEE, Dec. 10, 2000, pp. 455-458, XP010531803.
Schafbauer et al., Integration of High-Performance, Low-leakage and Mixed Signal Features into a 100nm CMOS Technology, 2002 Symposium on VLSI Technology, Digest of Technical Papers, Honolulu, Jun. 13, 2002, Symposium on VLSI Technology, New York, NY, IEEE, US, Jun. 11, 2002, pp. 62-63, XP001109821.
Lee et al., "Ultrathin Hafnium Oxide with Low leakage and Excellent Reliability for Alternative Gate Dielectric Application", Electron Devices Meeting, 1999. IEDM Technical Digest. International Washington, D.C., USA, Dec. 5-8, 1999, Piscataway, NJ, USA, IEEE, USA, IEEE, US, Dec. 5, 1999, pp. 133-136, XP010372022.
Guo et al., "Tunneling Leakage Current in Oxynitride: Dependence on Oxygen/Nitrogen Content", IEEE Electron Device Letters, IEEE Service Center, New York, NY, US, vol. 19, No. 6, Jun. 1998, XP011018413.

* cited by examiner

*Primary Examiner*—Thien F Tran
(74) *Attorney, Agent, or Firm*—Martine Penilla & Gencarella, LLP

(57) ABSTRACT

An integrated circuit having an enhanced on-off swing for pass gate transistors is provided. The integrated circuit includes a core region that includes core transistors and pass gate transistors. The core transistors have a gate oxide associated with a first thickness, the pass transistors having a gate oxide associated with a thickness that is less than the first thickness. In one embodiment, the material used for the gate oxide of the pass gate transistors has a dielectric constant that is greater than four, while the material used for the gate oxide of the core transistors has a dielectric constant that is less than or equal to four. A method for manufacturing an integrated circuit is also provided.

20 Claims, 6 Drawing Sheets

METHOD AND APPARATUS WITH VARYING GATE OXIDE THICKNESS

BACKGROUND

N-channel metal oxide semiconductor (NMOS) transistors tend to switch faster and have a longer lifetime than a corresponding P-channel metal oxide semiconductor (PMOS) transistor. Accordingly, pass gate transistors within a programmable logic device, such as a field programmable gate array (FPGA) are typically NMOS transistors. As feature sizes for transistors generally continue to decrease, pass gate transistors have been suffering in terms of performance. In particular, the ION/IOFF state for a pass gate transistor is being weakened. The ION/IOFF state is being weakened because as the power supply ($V_{cc}$) is being scaled downward as the gate length of the transistor shrinks, $V_t$ is not scaling. In essence, the on-off swing for the pass gate transistor is losing performance as the technology goes forward. This may limit the ability to further reduce the feature sizes.

As a result, there is a need to solve the problems of the prior art to enhance the on-off swing for a pass gate transistor as feature sizes continue to shrink.

SUMMARY

Broadly speaking, the present invention fills these needs by providing a method and apparatus for enhancing the on-off swing for a pass transistor that accommodates the feature size reduction. It should be appreciated that the present invention can be implemented in numerous ways, including as a method, a system, or an apparatus. Several inventive embodiments of the present invention are described below.

In one aspect of the invention, a pass gate transistor is defined on the thinner portion of the gate oxide, while core transistors are defined on the thicker portion of the gate oxide. Thus, a core region of an integrated circuit will have the pass gate transistors with a thinner gate oxide than the core transistors. In one embodiment, the thickness of the gate oxide for the pass gate transistors is at least 20% less than the thickness of the gate oxide of the core transistors. The different gate oxide thickness for the core and pass transistors may be achieved using a process-masking step. In one embodiment, the material used for the gate oxide of the pass gate transistors and the gate oxide of the core transistors is different, wherein the material for the gate oxide of the pass gate transistors has a dielectric constant of greater than four. For example, hafnium dioxide may be used for the gate oxide for the pass gate transistors, while silicon dioxide is used for the gate oxide of the core transistors. Of course, the material for the gate oxide for pass gate transistors and the gate oxide for the core transistors may be the same material. As will be explained further herein, the core transistors are defined as the majority of the transistors used in the product.

In another aspect of the invention, a method for manufacturing an integrated circuit is provided. In the method, a gate oxide layer is formed over a substrate through known etching processes, wherein the gate oxide has a portion with a first thickness and a portion with a second thickness. A pass gate transistor is defined on the thinner portion of the gate oxide, while a core transistor is defined on the thicker portion of the gate oxide. Thus, a core area of an integrated circuit will have the pass gate transistors with a thinner gate oxide than the core transistors.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
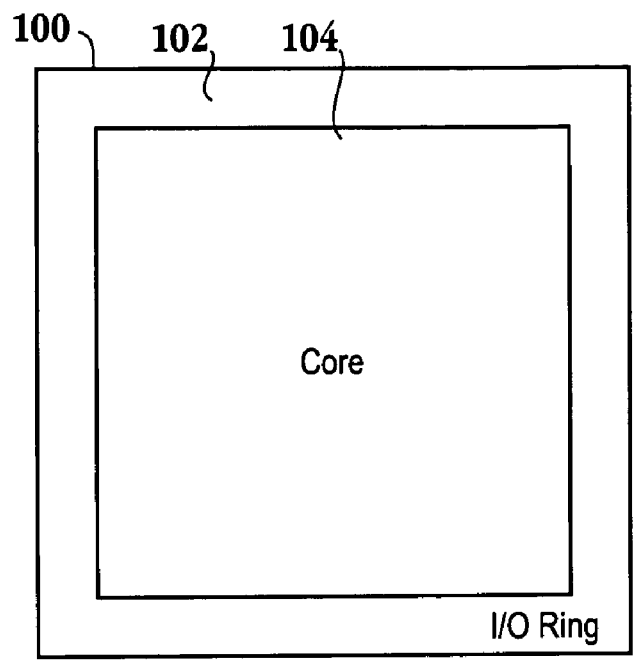
FIG. 1A is a simplified schematic diagram illustrating an integrated circuit in accordance with one embodiment of the invention.

An invention is described for an apparatus and method for enhancing the on/off swing for a pass gate transistor. It will be obvious, however, to one skilled in the art, that the present invention may be practiced without some or all of these specific details. In other instances, well known process operations have not been described in detail in order not to unnecessarily obscure the present invention.

An integrated circuit and method for manufacturing an integrated circuit are discussed herein. The integrated circuit includes a core region having transistors with different gate oxide thickness. In one embodiment, the core region includes pass gate transistors and core transistors, where the pass gate transistors are N-channel metal oxide semiconductor (NMOS) transistors. NMOS transistors tend to be utilized for pass gate transistors due to their characteristics of greater speed and smaller size as compared to P-channel metal oxide semiconductors (PMOS) transistors. Additionally, NMOS transistors tend to have a longer lifetime relative to PMOS transistors. The core transistors, which include complementary metal oxide semiconductors (CMOS) transistors, are limited by the PMOS transistors. The minimum gate oxide required to meet a 10 year lifetime for the PMOS transistors tends to be thicker, due to the tendency for the gate oxide to break down faster relative to an NMOS transistor. This characteristic of the PMOS transistor acts as a constraint for the NMOS transistor within the CMOS transistor. The embodiments described below exploit the differences between PMOS and NMOS transistors.

The pass gate transistors may allow access to various logic cells defined by the core transistors where the integrated circuit is a programmable logic device (PLD). The use of a thinner gate oxide layer for the pass gate transistors effectively allows for voltage passing through the pass gate transistor to scale with the voltage being supplied ($V_{cc}$). It is desired to maintain each pass gate transistor so that an on/off ratio represented by the current passing through the transistor is maximized. That is, the difference between the current passing through the transistor when the transistor is turned on (conductive) and when the transistor is turned off (non-conductive), is maximized. Ideally, this ratio would be represented by infinite conductivity when the transistor is turned on and infinite resistivity when the transistor is turned off.

One of the factors having an effect on this ratio is the thickness of the gate oxide. It should be appreciated that the gate of the NMOS transistor acts as a capacitor. The capacitance is a function of the inverse of the gate oxide thickness multiplied by the dielectric constant. Thus, the gate oxide should be as thin as possible without allowing excessive leakage or trading off performance due to parasitic capacitance. The embodiments described below provide for pass gate transistors within the core region of an integrated circuit having a thinner gate oxide layer than the remaining transistors, which may be referred to as core transistors. Additionally, a high K dielectric material may be used for the gate oxide to mitigate gate leakage due to the thinner gate oxide layer.

FIG. 1A is a simplified schematic diagram illustrating an integrated circuit in accordance with one embodiment of the invention. Integrated circuit 100 includes input output (I/O) ring 102, which surrounds core region 104. I/O ring 102 provides the pad connections for integrated circuit 100 to connect to a printed circuit board. It should be appreciated that the transistors within I/O ring 102 typically handle higher voltages than core region 104. Thus, the transistors associated with I/O ring 102 have a larger gate and thicker gate oxide to handle the higher voltages as compared to the transistors associated with core region 104. The embodiments described herein further differentiate between the transistors within core region 104. That is, pass gate transistors within core region 104 have a gate oxide layer with a smaller thickness than the gate oxide layer of the core transistors. In one embodiment, the thickness of the gate oxide for the core transistors is at least 20% larger than the thickness of the gate oxide for the pass transistors. In another embodiment where integrated circuit 100 is a PLD, such as a field programmable gate array (FPGA), the configurable logic blocks are arranged in an array with interspersed switches, i.e., pass gate transistors, that can rearrange the interconnections between the logic blocks. Each logic block within the core region is programmed to perform a logic function (such as AND, OR, XOR, etc.), and then the pass gate transistors are programmed to connect the corresponding blocks so that the complete logic functions are implemented. One skilled in the art will appreciate that for a PLD, static random access memory (SRAM) or flash bits may be used to control the pass gate transistors for each interconnection. By loading each corresponding bit with a logical one or a logical zero value, control over whether the pass gate transistor is conductive or non-conductive is possible. Thus, by using the SRAM/flash controlled pass gate transistors the PLD can be reprogrammed without removing the device from a circuit board. This embodiment may be referred to as an in-circuit reconfigurable or in-circuit programmable design.

Figure 1B:
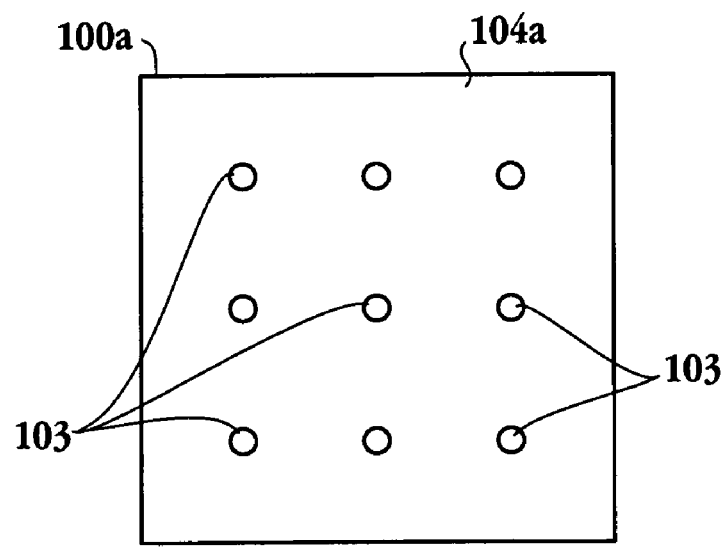
FIG. 1B is a simplified schematic diagram illustrating an alternative embodiment of the integrated circuit of FIG. 1A.

FIG. 1B is a simplified schematic diagram illustrating an alternative embodiment of the integrated circuit of FIG. 1A. Integrated circuit 100a includes core region 104a and I/O regions 103. One skilled in the art will appreciate that this configuration may be incorporated with a ball grid array or pin grid array packaging configuration. Thus, core region 104a is not surrounded by an I/O ring, as is the case in FIG. 1A. Instead, in FIG. 1B core region 104a has I/O transistors dispersed throughout the core region. Consequently, the term "core region" as used herein is not limited to a region surrounded by an I/O ring. The core region includes the core transistors where most of the signal processing is performed. The core region will typically operate at a lower voltage than the transistors of the I/O region. As used herein, the terms "core region" and "core area" may be used interchangeably to refer to the portion of the integrated circuit where core transistors are contained. The core transistors are the transistors that perform the majority of the signal processing and, as mentioned above, typically operate at a lower voltage than the I/O transistors. In addition, the gate oxide of the core transistors is generally thinner than the gate oxide for the I/O transistors, since the core transistors operate at a lower voltage. The embodiments described below further differentiate between the core transistors and the pass gate transistors, which are both contained within the core area of the integrated circuit.

Figure 2:
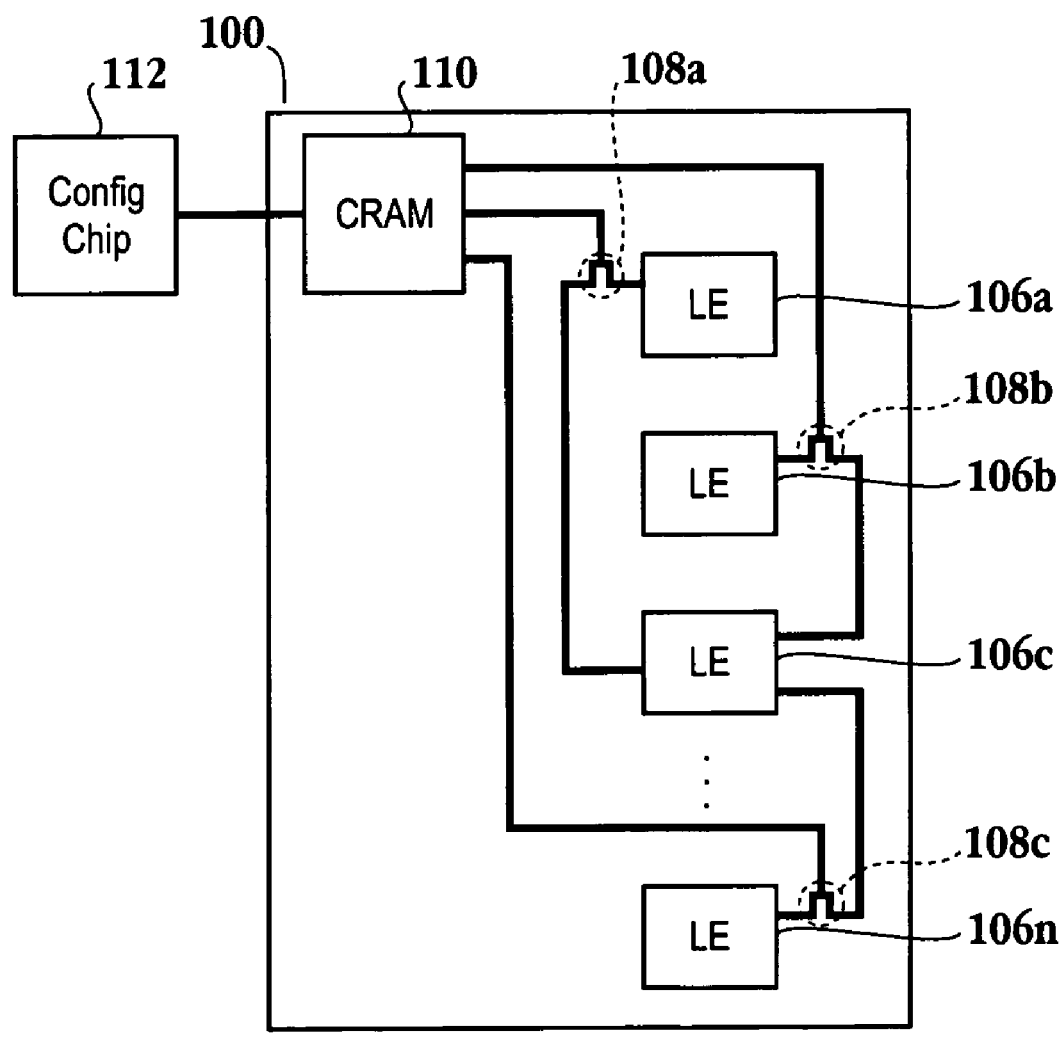
FIG. 2 is a simplified schematic diagram of an integrated circuit having pass transistors with a thinner gate oxide than the core transistors in accordance with one embodiment of the invention.

FIG. 2 is a simplified schematic diagram of an integrated circuit having pass transistors with a thinner gate oxide than the core transistors in accordance with one embodiment of the invention. Integrated circuit 100 is configured as a programmable logic device. The PLD includes configuration random access memory (CRAM) 110, logic elements 106a through 106n and pass gate transistors 108a through 108c. CRAM 110 holds the configuration for PLD 100, which is downloaded from configuration chip 112. The configuration captured in CRAM 110 enables the activation of pass gates 108a through 108c, depending on the value of the corresponding signal sent from CRAM 110 to the corresponding pass gate transistor. Thus, for pass gate transistor 108a, if a voltage associated with a logical high value is transmitted to the gate of pass gate 108a, the connection between logical element 106a and logical element 106c is activated. That is, pass gate 108a becomes conductive to define a connecting pathway between logical elements 106a and 106c. However, if a logical zero value is transmitted to the gate of transistor 108a, the connection between logical element 106a and logical element 106c is not enabled. One skilled in the art will appreciate that logical elements 106a-106c are defined through core transistors, e.g., complimentary metal oxide semiconductor (CMOS) transistors. In one exemplary embodiment, logical elements 106a-106c are known logic gates or combinations of known logic gates.

Figure 3:
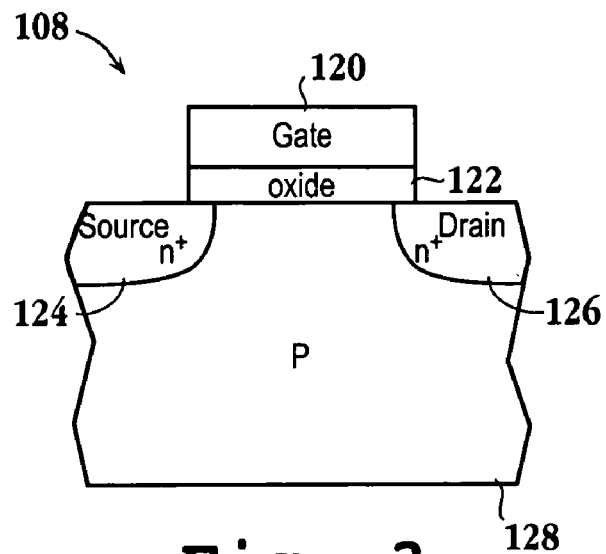
FIG. 3 is a simplified schematic diagram of a pass gate transistor in accordance with one embodiment of the invention.

FIG. 3 is a simplified schematic diagram of a pass gate transistor in accordance with one embodiment of the invention. Pass gate transistor 108 may be representative of pass gate transistors 108a through 108c illustrated with reference to FIG. 2. Pass gate transistor 108 includes gate 120 formed over oxide layer 122. Oxide layer 122 is formed over P substrate 128. P substrate 128 includes source region 124 and drain region 126, both identified as n wells. Accordingly, pass gate transistor 108 is a NMOS transistor. In one embodiment, oxide layer 122 is at least 20% thinner than the oxide layer of the core transistors. Thus, where the oxide layer thickness within the core transistors is between about 12 angstroms (Å) and about 18 Å, the oxide layer thickness of the pass gate transistors is between about 8 Å and about 12 Å. The oxide layer for the pass gate transistors and the core transistors may be composed of either the same material or different material. For example, the oxide layer for the core transistors and the pass gate transistors may be silicon dioxide in one embodiment. Alternatively, the oxide layer for the core transistors may be a material having a dielectric constant of less than or equal to four, e.g., silicon dioxide, while the oxide layer for the pass gate transistors is a material having a dielectric constant that is greater than four, e.g., hafnium dioxide. Exemplary materials having a dielectric constant greater than four are listed in Table 1. Of course, the oxide layers referred to above may both be composed of the same material or different materials having a dielectric constant greater than four. Here, the gate oxide layer for the pass gate transistors is thinner than the gate oxide for the core transistors.

| Material | Formula | K |
| --- | --- | --- |
| Silicon nitride | $Si_3N_4$ | 7 |
| oxynitrides | $Si_xN_yO_z$ | 4.1-7 |
| Aluminum oxide | $Al_2O_3$ | 9 |
| Tantalum pentoxide | $Ta_2O_5$ | 25 |
| Hafnium oxide | $HfO_2$ | 30-40 |
| Zirconium oxide | $ZrO_2$ | 25 |
| Barium strontium titanate | $BaSrTiO_3$ | 300 |

Figure 4:
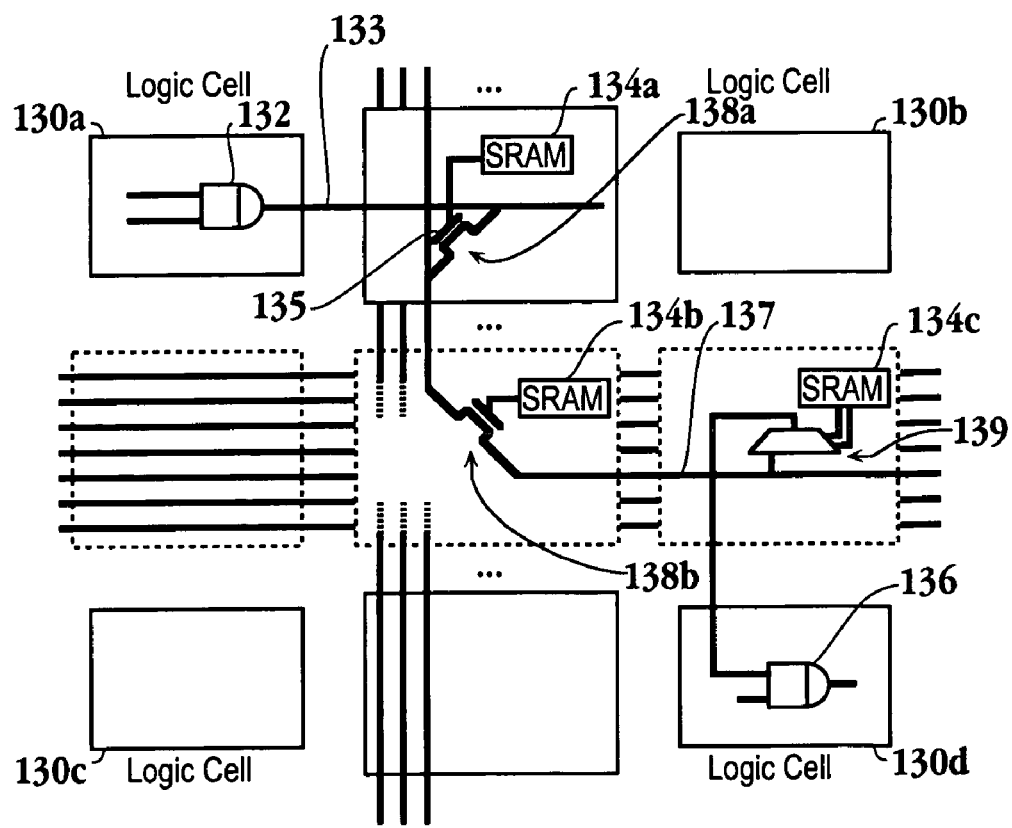
FIG. 4 is a simplified schematic diagram of SRAM-controlled pass gate transistor switches that drive logic block inputs for a programmable logic device in accordance with one embodiment of the invention.

FIG. 4 is a simplified schematic diagram of SRAM-controlled pass gate transistor switches that drive logic block inputs for a programmable logic device in accordance with one embodiment of the invention. Block 130a includes logic cell 132, which is represented by an AND gate. Logic cell 132 is connected to logic cell 136, which is also represented by an AND gate. Pass gate transistor 138a provides a programmable connection between lines 133 and 135. Pass gate transistor 138b provides a programmable connection between lines 135 and 137. Pass transistors 138a and 138b are controlled by SRAMs 134a and 134b, respectively. SRAM 134c provides an input and a select signal to multiplexor 139, which in turn provides output to logic cell 136 of block 130d. Thus, logic cell 132 is placed in electrical communication with logic cell 136, through pass gate transistors 138a and 138b, when placed in a conductive state by the output of SRAMs 134a and 134b, respectively.

It should be appreciated that blocks 130a-d of FIG. 4 may include a plurality of logical elements and may be referred to as a logical array block commonly used within a PLD. As used herein, a logical element, also referred to as a logic cell, may be any suitable single or multiple block of logic, e.g., a register, a look up table, combinatorial logic, a logical array block, an adaptive logic module (ALM), digital signal processor (DSP) blocks, or any combination thereof, etc. In essence, a logical element may be any lower level logic block employed in an integrated circuit design. It should be further appreciated that SRAMs 134a and 134b may be memory cells physically located within the same memory region and are shown separately for ease of description.

Figure 5:
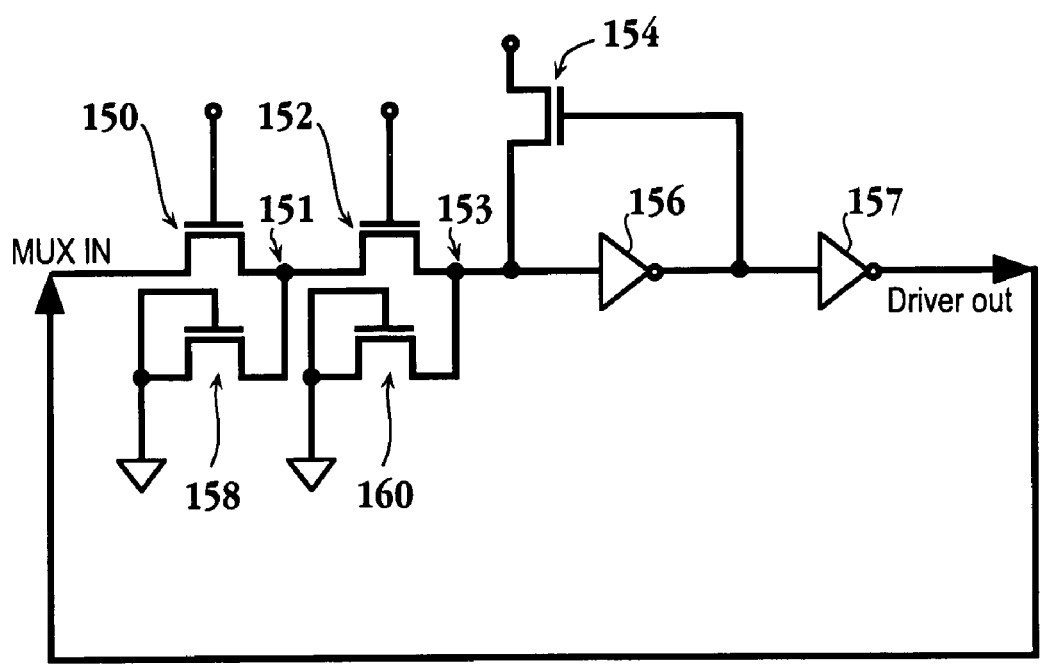
FIG. 5 illustrates a two-stage multiplexor used in the evaluation of the pass gate transistors having a thinner gate oxide than the core transistors in accordance with one embodiment of the invention.

FIG. 5 illustrates a two-stage multiplexor used in the evaluation of the pass gate transistors having a thinner gate oxide than the core transistors in accordance with one embodiment of the invention. Pass gate transistors 150 and 152 have a thinner gate oxide than the core transistors as described above with reference to FIGS. 1-3. Multiplexor (mux) in signal is propagated through pass gate transistors 150 and 152. Nodes 151 and 153 are connected to transistors 158 and 160, respectively, which are connected to ground. Transistors 158 and 160 function as interconnect capacitors in order to compensate for the capacitance losses of a signal traveling through various interconnect levels. When the signal to the gate of pass gate transistors 150 and 152 allows the mux in signal to pass, i.e., the pass transistors become conductive because of the voltage applied to the corresponding gate, the signal is propagated to inverter 156 and back to pull up transistor 154 as well as to inverter 157. The results of this evaluation through the 18:1 2-stage mux are tabulated in Tables 2 and 3. Table 2 represents the time delay in picoseconds (ps) between a gate oxide thickness of 12 Å and 14 Å. As illustrated, the thinner gate oxide 12 Å was on average 12% faster than the thicker gate oxide of 14 Å. Table 3 illustrates the difference in standby leakage current in μA between a gate oxide thickness of 12 Å and 14 Å. As illustrated, when the input voltage is 1.1 volts, there is an increase in leakage current of 16%.

TABLE 2

| Delay Component (ps) | 14 Å Gate Oxide thickness | 12 Å Gate Oxide thickness | Delta |
| --- | --- | --- | --- |
| Rising | 119.6 | 101.1 | −15% |
| Falling | 74.2 | 70.1 | −6% |
| Average | 96.9 | 85.6 | −12% |

TABLE 3

| Input Voltage | 14 Å Gate Oxide thickness | 12 Å Gate Oxide thickness | Delta |
| --- | --- | --- | --- |
| 0 V | 167.5 | 169.2 | 1% |
| 1.1 V | 178.8 | 207.7 | 16% |

The gate oxide material for the evaluation scheme of FIG. 5 is silicon dioxide. Thus, in one embodiment, reducing the silicon dioxide thickness for the gate oxide layer from 14 Å to 12 Å, which is approximately a 15% reduction, will provide the increase in on/off swing represented in Table 2, as long as the corresponding increase in leakage of FIG. 3 is acceptable for the particular application. It should be appreciated that if a high k dielectric is used for the gate oxide, such as the high k dielectrics listed in table 1, then the on/off swing will be enhanced without the corresponding increase in leakage because of the high capacitive storage capability of the high k dielectrics. Additionally, a greater reduction in the gate oxide thickness will correspondingly further improve the on/off swing.

Figure 6A:
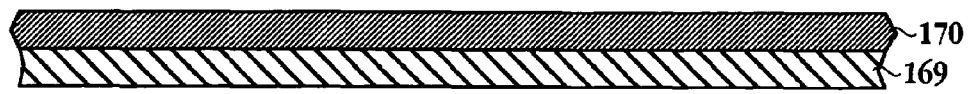
FIGS. 6A through 6D illustrate exemplary processing operations where a core region is being processed in order to define core transistors and pass gate transistors having a different gate oxide thickness in accordance with one embodiment of the invention.
Figure 6B:
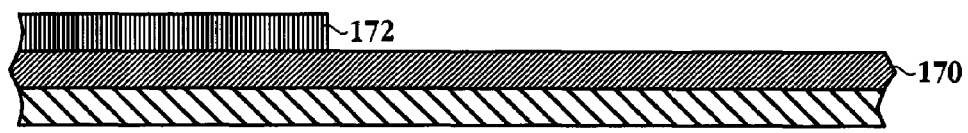
Figure 6C:
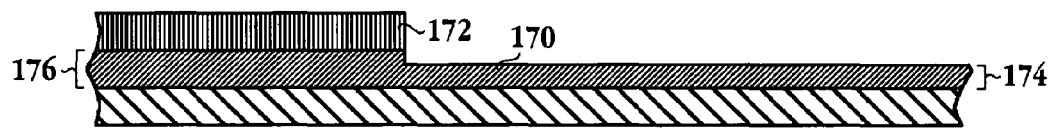
Figure 6D:

FIGS. 6A through 6D illustrate exemplary processing operations where a core region is being processed in order to define core transistors and pass gate transistors having a different gate oxide thickness in accordance with one embodiment of the invention. In FIG. 6A gate oxide layer 170 is formed over substrate 169. One skilled in the art will appreciate that gate oxide layer 170 may be thermally grown, or spun on. Additionally, the material of gate oxide layer 170 may be silicon dioxide, any of the high k dielectric material of Table 1, or any other suitable gate oxide material. In FIG. 6B photoresist layer 172 is disposed over a portion of gate oxide layer 170. Photoresist layer 172 may be spun on and then patterned and developed according to generally known techniques. Performing an etch operation on gate oxide layer 170 results in one portion of the gate oxide layer having layer thickness 174 and an unexposed portion of the gate oxide layer retaining an original thickness 176. Thus, upon removal of photoresist layer 172, gate oxide layer 170 has a different thickness in the exposed and unexposed portions as illustrated in FIG. 6D. In one embodiment, the different thickness of the gate oxide layer may be obtained by thermally growing the gate oxide, where portions of the gate oxide are implanted with different ions or levels of ions. These different implantation ions or levels of ions will affect the thermal growth rate to define portions of the gate oxide having a different thickness.

Figure 6E:
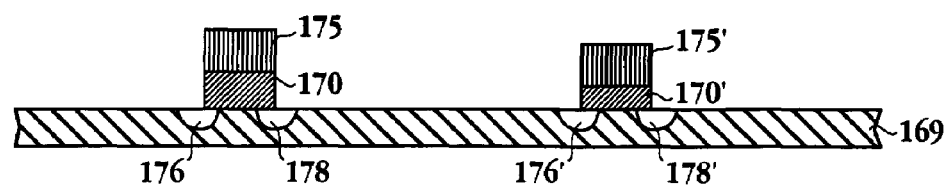
FIG. 6E is a simplified schematic diagram illustrating a pass gate transistor and a core transistor with respective gate oxides having a different thickness in accordance with one embodiment of the invention.

FIG. 6E is a simplified schematic diagram illustrating a pass gate transistor and a core transistor with gate oxides having a different thickness in accordance with one embodiment of the invention. As illustrated, the core transistor has a gate oxide layer 170 that is thicker than the gate oxide layer 170' of the pass gate transistor. It should be appreciated that the core transistor, which includes gate 174, gate oxide 170, source 176, and drain 178, and pass gate transistor, which includes gate 174', gate oxide 170', source 176', and drain 178' may be formed through well known etch, masking, and implantation operations. It should be further appreciated that the pass gate transistors discussed herein may be distributed throughout the core region or core area of an integrated circuit without any limitations on location. As mentioned above, the core region or core area refers to the area where the majority of core transistors are located. In one embodiment, the core transistors include CMOS transistors. Hence, the gate oxide thickness for the CMOS transistors is limited by the PMOS transistors. As the pass gate transistors are defined by NMOS transistors, the pass gate transistors are freed from the restrictions imposed by the PMOS transistors. Therefore, a thinner gate oxide may be incorporated with the pass gate transistors as described herein.

Figure 7:
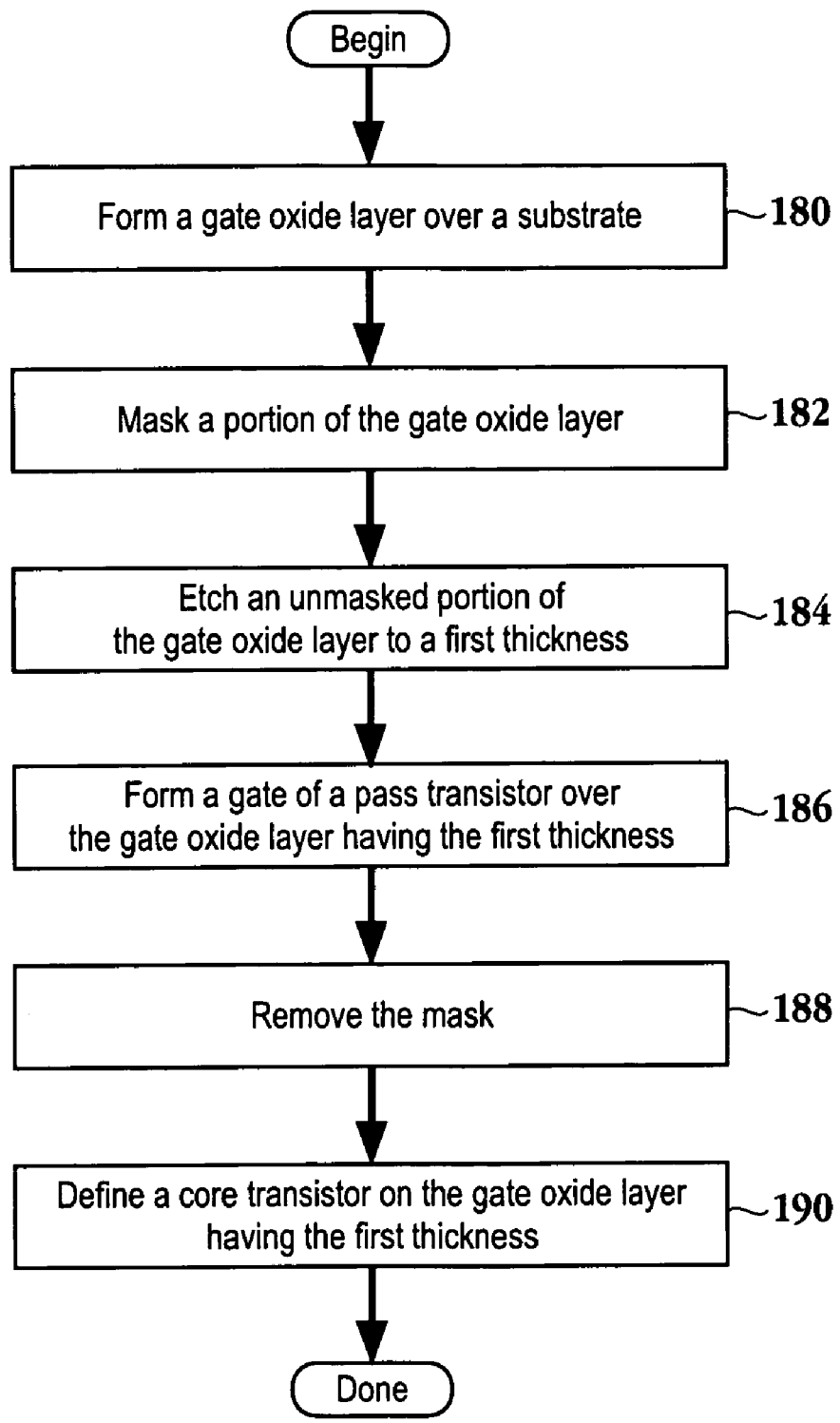
FIG. 7 is a flow chart diagram illustrating the method operations for manufacturing an integrated circuit having core transistors with a gate oxide thickness differing from a gate oxide thickness for pass gate transistors.

FIG. 7 is a flow chart diagram illustrating the method operations for manufacturing an integrated circuit having core transistors with a gate oxide thickness differing from a gate oxide thickness for pass gate transistors. The method initiates with operation 180 where a gate oxide layer having a first thickness is formed over a substrate. This may include thermally growing the layer or spinning on the gate oxide layer. Then, in operation 182 a mask is deposited over a portion of the gate oxide layer. The method then advances to operation 184 where an exposed portion of the gate oxide layer is etched to a second thickness. In one embodiment, the second thickness is between about 8 angstroms and 12 angstroms. The method then moves to operation 186 where a gate of a pass transistor is formed over the gate oxide layer having the second thickness. Thereafter, the mask is removed from the portion of the gate oxide layer in operation 188. For example, a photoresist stripping operation may be used to achieve removal of the mask. It should be appreciated that gates for core transistors may be defined prior to or after the gates for the pass transistors. However, the gates for the core transistors are disposed over a gate oxide having a second thickness. In one embodiment, the second thickness is between about 12 angstroms and 18 angstroms. Thus, the gate oxide for the core transistor is at least about 20% greater than the gate oxide for the pass gate transistor. In operation 190 a core transistor is then defined on the gate oxide layer having the first thickness.

In summary, the above-described invention provides a method and apparatus for enhancing the Ion/Ioff state for pass gate transistors of an integrated circuit. By utilizing a pass gate transistor with a thinner gate oxide thickness, the transistor can have a larger swing between on and off states. In one embodiment, the gate oxide thickness is at least 20% less that the oxide thickness for the core transistors. By utilizing a high K dielectric, i.e., a material with a dielectric constant greater than four, the increased leakage experienced when using a thin gate oxide with silicon dioxide is avoided. Of course, silicon dioxide may be used for the gate oxides of both the core transistors and the pass gate transistors as long as the leakage is acceptable. The embodiments described above extend the life of NMOS pass gate transistors as the power supply $V_{cc}$ scales. In addition, the performance-power relationship is improved through the above-described embodiments. The embodiments described herein have no negative impact as far as the chip real estate required to house the integrated circuit.

The integrated circuit design being optimized through the above-described embodiments may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not be limited to the details given herein, but may be modified within the scope and equivalents of the appended claims. In the claims, elements and/or steps do not imply any particular order of operation, unless explicitly stated in the claims.

What is claimed is:

1. An integrated circuit, comprising:
   a core area, the core area having core transistors and pass gate transistors, the core transistors and the pass gate transistors operating at a same voltage, the core transistors having a gate oxide associated with a first thickness, the pass gate transistors having a gate oxide associated with a second thickness, wherein the second thickness is less than the first thickness.

2. The integrated circuit of claim 1, further comprising:
   an input/output (I/O) ring surrounding the core area, the I/O ring including I/O transistors having a gate oxide associated with a third thickness, wherein the third thickness is greater than the first thickness.

3. The integrated circuit of claim 1, further comprising:
   a random access memory (RAM) region defined within the core area, wherein each gate of the pass gate transistors is in electrical communication with the RAM region, such that a logical signal from the RAM region determines whether each of the pass gate transistors is in a conducting or a non-conducting state.

4. The integrated circuit of claim 1, wherein the first thickness is between about 12 Å and about 18 Å and the second thickness is between about 8 Å and about 12 Å.

5. The integrated circuit of claim 1, wherein the gate oxide associated with the second thickness has a dielectric constant greater than four.

6. The integrated circuit of claim 1, wherein a material of the gate oxide associated with the second thickness is selected from the group consisting of hafnium oxide, aluminum oxide, zirconium oxide, barium strontium titanate, and oxynitrides.

7. The integrated circuit of claim 1, wherein the core transistors are complementary metal oxide semiconductor (CMOS) transistors and the pass gate transistors are N-channel metal oxide semiconductor (NMOS) transistors.

8. The integrated circuit of claim 1, wherein a material for the gate oxide associated with the first thickness and a material associated with the gate oxide associated with the second thickness are identical.

9. A programmable logic device (PLD), comprising:
a core region having transistors defined therein, a portion of the transistors having a gate oxide associated with a dielectric constant that is greater than four, wherein remaining transistors of the core region including a gate oxide associated with a dielectric constant that is less than or equal to four, wherein each of the portion of the transistors are in communication with a memory region, the memory region supplying a logical signal to each of the portion of the transistors.

10. The PLD of claim 9 wherein the portion of the transistors are pass gate transistors that enable respective communication paths defined between the remaining transistors when the pass gate transistors are activated.

11. The PLD of claim 9, further comprising:
input/output (I/O) transistors providing connections to a printed circuit board.

12. The PLD of claim 9, wherein the logical signal defines whether a corresponding one of the portion of the transistors is one of conductive or non-conductive.

13. The PLD of claim 9, wherein a thickness for the gate oxide of the portion of transistors is less than a thickness for the gate oxide for the remaining transistors.

14. The PLD of claim 9, wherein the gate oxide associated with the dielectric constant that is greater than four is composed of hafnium oxide.

15. The PLD of claim 9, wherein each of the transistors of the core region operate at a same voltage.

16. An integrated circuit, comprising:
a core area, the core area having core transistors and pass gate transistors, the core transistors having a gate oxide associated with a first thickness, the pass gate transistors having a gate oxide associated with a second thickness, wherein the second thickness is less than the first thickness; and
input/output (I/O) transistors having a gate oxide associated with a third thickness, wherein the third thickness is greater than the first thickness.

17. The integrated circuit of claim 16, wherein the core transistors and the pass gate transistors operating at a same voltage.

18. The integrated circuit of claim 16, further comprising:
a random access memory (RAM) region defined within the core area, wherein each gate of the pass gate transistors is in electrical communication with the RAM region, such that a logical signal from the RAM region determines whether each of the pass gate transistors is in a conducting or a non-conducting state.

19. The integrated circuit of claim 16, wherein the I/O transistors are dispersed throughout the core area.

20. The integrated circuit of claim 16, wherein the I/O transistors are defined within an I/O ring surrounding the core area.

* * * * *